(12) United States Patent
Soga

(10) Patent No.: US 11,489,497 B2
(45) Date of Patent: Nov. 1, 2022

(54) BIAS CIRCUIT

(71) Applicant: Murata Manufacturing Co., Ltd., Kyoto (JP)

(72) Inventor: Takashi Soga, Kyoto (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 116 days.

(21) Appl. No.: 16/925,533

(22) Filed: Jul. 10, 2020

(65) Prior Publication Data

US 2021/0013842 A1 Jan. 14, 2021

(30) Foreign Application Priority Data

Jul. 11, 2019 (JP) .............................. JP2019-128866

(51) Int. Cl.
| | |
|---|---|
| H03F 1/32 | (2006.01) |
| H03F 3/19 | (2006.01) |
| H03H 7/06 | (2006.01) |
| H03F 3/21 | (2006.01) |

(52) U.S. Cl.
CPC ............... *H03F 1/32* (2013.01); *H03F 3/21* (2013.01); *H03H 7/06* (2013.01); *H03F 3/19* (2013.01); *H03F 2200/451* (2013.01)

(58) Field of Classification Search
CPC ............ H03F 1/32; H03F 1/3205; H03F 3/04
See application file for complete search history.

(56) References Cited

U.S. PATENT DOCUMENTS

| | | | | |
|---|---|---|---|---|
| 7,365,604 B2 * | 4/2008 | Luo | ........................... | H03F 1/30 |
| | | | | 330/285 |
| 10,148,226 B2 | 12/2018 | Soga | | |
| 2016/0322944 A1 | 11/2016 | Hase | | |

FOREIGN PATENT DOCUMENTS

| | | |
|---|---|---|
| CN | 106100594 A | 11/2016 |
| JP | 2018-98766 A | 6/2018 |

* cited by examiner

*Primary Examiner* — Samuel S Outten
*Assistant Examiner* — Khiem D Nguyen
(74) *Attorney, Agent, or Firm* — Pearne & Gordon LLP

(57) ABSTRACT

A bias circuit includes first to fourth transistors and a phase compensation circuit. In the first transistor, a reference current or voltage is supplied to a first terminal, and the first terminal and a second terminal are connected. In the second transistor, a first terminal is connected to the first transistor, and a third terminal is grounded. In the third transistor, a power supply voltage is supplied to a first terminal, a second terminal is connected to the first transistor, and a bias current or voltage is supplied from a third terminal to an amplifier transistor. In the fourth transistor, a first terminal is connected to the third transistor, a second terminal is connected to the second transistor, and a third terminal is grounded. The phase compensation circuit is provided in a path extending from the fourth transistor to the third transistor through the second and first transistors.

20 Claims, 7 Drawing Sheets

BIAS CIRCUIT

This application claims priority from Japanese Patent Application No. 2019-128866 filed on Jul. 11, 2019. The content of this application is incorporated herein by reference in its entirety.

BACKGROUND

The present disclosure relates to a bias circuit. In mobile communication terminals, such as cellular phones, a power amplifier circuit is used that amplifies a radio frequency (RF) signal to be transmitted to a base station. The power amplifier circuit includes, for example, a transistor that amplifies an input signal, and a bias circuit that determines an operating point of the transistor.

In the power amplifier circuit, power gain has to be kept as constant as possible regardless of output power of an RF signal to maintain linearity. For example, Japanese Unexamined Patent Application Publication No. 2018-98766 discloses a power amplifier circuit in which a bias circuit includes a negative feedback path and can inhibit deterioration of linearity by supplying a stable bias voltage to a transistor that amplifies an RF signal. This bias circuit includes, in the negative feedback path, a filter circuit that attenuates a frequency band of a fundamental of an RF signal and thus has frequency characteristics in which a gain characteristic is exhibited at a direct current (DC) operating point and in a modulation wave band and in which an attenuation characteristic is exhibited in the fundamental band.

In recent years, as a wireless local area network (LAN) that supports a new communication standard, such as the fifth generation mobile communication system (5G), so-called Wi-Fi 6 (registered trademark) is being put to practical use. In such a new communication standard, it is expected that communication density will further increase and a modulation wave band will become further high (for example, about several tens to about several hundred MHz) in comparison with an existing communication standard. In a power amplifier circuit that supports a communication standard in which a modulation wave band is relatively high, if the bias circuit disclosed in Japanese Unexamined Patent Application Publication No. 2018-98766 is used, the band in which the bias circuit exhibits the gain characteristic also has to be widened.

However, when the gain band of the bias circuit is widened, a sufficient phase margin is not able to be obtained, and negative feedback in the bias circuit can become unstable. On the other hand, when the bias circuit is used in a band in which a sufficient phase margin is provided, it is difficult to obtain high voltage gain, the amount of feedback of the bias circuit therefore becomes insufficient, and, as a result, signal linearity can deteriorate.

BRIEF SUMMARY

The present disclosure has been made in view of such circumstances and aims to provide a bias circuit that enables an improvement in signal amplification linearity even if a frequency in a modulation wave band is relatively high.

To achieve this aim, a bias circuit according to one aspect of the present disclosure is a bias circuit configured to supply a bias current or bias voltage to an amplifier transistor configured to amplify an input signal. The bias circuit includes a first transistor, a second transistor, a third transistor, and a fourth transistor that each includes a first terminal, a second terminal, and a third terminal; and a phase compensation circuit configured to advance a phase of a signal. In the first transistor, a reference current or reference voltage is supplied to the first terminal, and the first terminal and the second terminal are connected to each other. In the second transistor, the first terminal is connected to the third terminal of the first transistor, and the third terminal is grounded. In the third transistor, a power supply voltage is supplied to the first terminal, the second terminal is connected to the first terminal of the first transistor, and the bias current or bias voltage is supplied from the third terminal to the amplifier transistor. In the fourth transistor, the first terminal is connected to the third terminal of the third transistor, the second terminal is connected to the second terminal of the second transistor, and the third terminal is grounded. The phase compensation circuit is provided in a path extending from the second terminal of the fourth transistor to the second terminal of the third transistor through the second transistor and the first transistor.

The present disclosure can provide the bias circuit that enables an improvement in signal amplification linearity even if a frequency in a modulation wave band is relatively high.

Other features, elements, characteristics and advantages of the present disclosure will become more apparent from the following detailed description of embodiments of the present disclosure with reference to the attached drawings.

DETAILED DESCRIPTION

Figure 1:
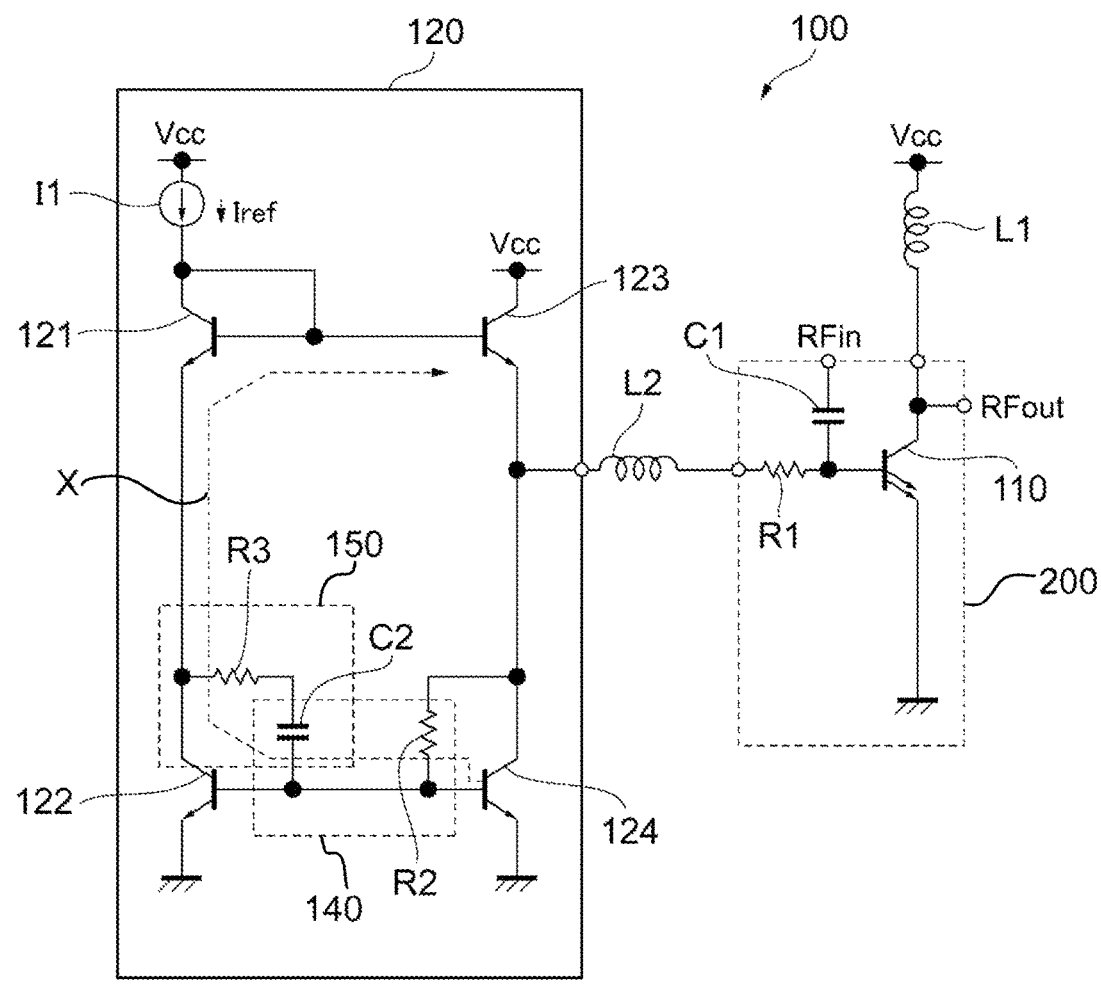
FIG. 1 illustrates an example of a configuration of a power amplifier circuit including a bias circuit according to a first embodiment of the present disclosure.

Embodiments of the present disclosure will be described in detail below with reference to the drawings. The same elements are denoted by the same reference numerals, and a repeated description thereof is omitted.

FIG. 1 illustrates an example of a configuration of a power amplifier circuit including a bias circuit according to a first embodiment of the present disclosure. A power amplifier circuit 100 is installed, for example, in a mobile communication device, such as a cellular phone, and is used to amplify power of a radio frequency (RF) signal to be transmitted to a base station. The power amplifier circuit 100 amplifies transmission signals of communication standards, such as the second generation mobile communication system (2G), the third generation mobile communication system (3G), the fourth generation mobile communication system (4G), the fifth generation mobile communication system (5G), long term evolution (LTE)-frequency division duplex (FDD), LTE-time division duplex (TDD), LTE-Advanced, and LTE-Advanced Pro. A fundamental band of an RF signal ranges, for example, from about several hundred MHz to about several tens of GHz. A communication standard and a fundamental band of a signal to be amplified by the power amplifier circuit 100 are not limited to these.

As illustrated in FIG. 1, the power amplifier circuit 100 includes, for example, a transistor 110, a bias circuit 120, a capacitor C1, inductors L1 and L2, and a resistance element R1.

The transistor 110 (amplifier transistor) amplifies an RF signal RFin (input signal) and outputs an RF signal RFout. The transistor 110 is constituted, for example, by a bipolar transistor, such as a heterojunction bipolar transistor (HBT).

In the transistor 110, a power supply voltage Vcc is supplied to a collector through the inductor L1, the RF signal RFin is supplied to a base through the capacitor C1, and an emitter is grounded. A bias current or bias voltage is supplied from the bias circuit 120 to the base of the transistor 110 through the inductor L2 and the resistance element R1. Thus, the RF signal RFout obtained by amplifying the RF signal RFin is output from the collector of the transistor 110.

The bias circuit 120 determines an operating point of the transistor 110 by supplying a bias current or bias voltage to the base of the transistor 110. For example, the bias circuit 120 adjusts an operating point of the transistor 110 by adjusting the level of a bias current or bias voltage in accordance with a reference current Iref. Details of a configuration of the bias circuit 120 will be described later.

In the capacitor C1, the RF signal RFin is supplied to one end, and the other end is connected to the base of the transistor 110. The capacitor C1 blocks a direct-current component included in an RF signal and allows an alternating-current component to pass therethrough.

In the inductor L1, the power supply voltage Vcc is supplied to one end, and the other end is connected to the collector of the transistor 110. The inductor L1 keeps an RF signal from entering a power supply circuit (not illustrated) side.

The resistance element R1 is connected in series between an output terminal of the bias circuit 120 and the base of the transistor 110. The resistance element R1 is a ballast resistor connected in series with the base of the transistor 110. More specifically, the transistor 110 has a thermal positive feedback characteristic in which, when the temperature of an element increases, a collector current increases to thereby cause a further increase in the temperature and a further increase in the collector current. When the ballast resistor is provided for the base of the transistor 110, a voltage drop determined by the product of a resistance value of the ballast resistor and a base current of the transistor 110 occurs. Hence, the voltage drop at the ballast resistor increases as the base current of the transistor 110 increases, and a bias voltage to be supplied to the base of the transistor 110 decreases, resulting in suppression of an increase in the collector current.

The inductor L2 is provided between the output terminal of the bias circuit 120 and the base of the transistor 110 and is connected in series with the resistance element R1. The inductor L2 keeps an RF signal from entering a bias circuit 120 side. The power amplifier circuit 100 does not have to include the resistance element R1 and the inductor L2 and may include a parasitic resistance and a parasitic inductance that are generated when the transistor 110 and the bias circuit 120 are connected.

The transistor 110, the capacitor C1, and the resistance element R1 may be formed, for example, as a single cell 200. Although FIG. 1 illustrates a circuit diagram corresponding to the single cell 200, the power amplifier circuit 100 may include a plurality of cells having the same configuration as the cell 200.

Next, the configuration of the bias circuit 120 will be described in detail. The bias circuit 120 includes four transistors 121 to 124, a current source I1, two resistance elements R2 and R3, and a capacitor C2. In this embodiment, for example, all of the four transistors 121 to 124 are HBTs and are fabricated on the same chip by a bipolar process.

In the transistor 121 (first transistor), a reference current Iref is supplied from the current source I1 to a collector (first terminal), the collector and a base (second terminal) are connected to each other, and an emitter (third terminal) is connected to a collector of the transistor 122.

In the transistor 122 (second transistor), the collector (first terminal) is connected to the emitter of the transistor 121, a base (second terminal) is connected to a base of the transistor 124, and an emitter (third terminal) is grounded. Furthermore, the collector and base of the transistor 122 are connected by the resistance element R3 (second resistance element) and the capacitor C2 (second capacitor) that are connected in series with each other. When the transistor 121 and the transistor 122 are cascaded, a voltage (for example, about 2.6 V) corresponding to the reference current Iref is generated at the collector of the transistor 121.

In the transistor 123 (third transistor), a power supply voltage Vcc is supplied to a collector (first terminal), a base (second terminal) is connected to the collector of the transistor 121, and an emitter (third terminal) is connected to the base of the transistor 110 through the inductor L2 and the resistance element R1. A voltage generated by the transistor 121 and the transistor 122 is supplied to the base of the transistor 123. Thus, a bias current corresponding to the reference current Iref is supplied from the emitter of the transistor 123 to the base of the transistor 110. Furthermore, a bias voltage is supplied from the emitter of the transistor 123 to the base of the transistor 110.

In the transistor 124 (fourth transistor), a collector (first terminal) is connected to the emitter of the transistor 123, the base (second terminal) is connected to the base of the transistor 122, and an emitter (third terminal) is grounded. Furthermore, the collector and base of the transistor 124 are connected by the resistance element R2 (first resistance element).

A power supply voltage Vcc is supplied to the current source I1, and the reference current Iref is passed through the transistor 121 and the transistor 122.

In the resistance element R2, one end is connected to the collector of the transistor 124, and the other end is connected to the base of the transistor 124.

The resistance element R3 and the capacitor C2 are connected in series with each other, one end of this series connection is connected to the collector of the transistor 122, and the other end is connected to the base of the transistor 122. Function effects of the resistance element R3 and the capacitor C2 will be described later.

In the bias circuit 120, when output power of the transistor 110 increases, a bias current supplied from the emitter of the transistor 123 to the base of the transistor 110 increases, and an emitter voltage of the transistor 123 is about to rise. At this time, a base voltage of the transistor 124 also rises through the resistance element R2, and the transistor 124 thus enters an on state. A current passes through the transistor 124, thereby keeping the emitter voltage of the transistor 123 from rising excessively.

Furthermore, the resistance element R2 and the capacitor C2 constitute a low pass filter circuit 140 that attenuates a frequency component of a fundamental of an RF signal RFin to be input to the transistor 110. More specifically, when the RF signal RFin propagates to the collector of the transistor 124, the resistance element R2 and the capacitor C2 function as the low pass filter circuit that attenuates the fundamental, thereby keeping the base voltage of the transistor 124 from varying. Thus, the bias circuit 120 can supply a bias current and a bias voltage that are stable to the transistor 110. The low pass filter circuit 140 may have a frequency characteristic, for example, of attenuating a fundamental (ranging, for example, from about several hundred MHz to about several tens of GHz) of an RF signal and a frequency component having a higher frequency than the fundamental and passing a modulation wave (ranging, for example, from about several MHz to about several tens of MHz) and a frequency component having a lower frequency than the modulation wave.

Furthermore, in the bias circuit 120, when the emitter voltage of the transistor 123 is about to rise, a base voltage of the transistor 122 also rises through the resistance element R2. This causes a current that passes through the transistor 122 to increase and causes a collector voltage of the transistor 121 to decrease. Because of this, a base voltage of the transistor 123 connected to the collector of the transistor 121 decreases, and, as a result, negative feedback operates in which a current that passes through transistor 123 decreases.

Thus, the bias circuit 120 includes a path X extending from the base of the transistor 124 to the base of the transistor 123 through the base of the transistor 122, the collector of the transistor 122, the emitter of the transistor 121, and the base of the transistor 121 and providing negative feedback. The path X keeps the emitter voltage of the transistor 123 from rising excessively, and thus a bias current and a bias voltage that are stable are supplied.

Here, provision of, for example, the low pass filter circuit 140 in the path X, or the like causes a phase lag of a signal in the path X. When this phase lag approaches, for example, about 180 degrees, negative feedback gets close to positive feedback, and oscillation thus occurs, undermining the stability of the bias circuit 120. Hence, to ensure the stability of the bias circuit 120, a certain margin (a so-called phase margin) has to be provided for a phase lag of about 180 degrees. In particular, in a new communication standard, such as Wi-Fi 6, however, when a modulation wave band of a signal is high, it is difficult to provide a sufficient phase margin.

To deal with this issue, the bias circuit 120 includes a high pass filter circuit 150 as a phase compensation circuit. The high pass filter circuit 150 is constituted by the resistance element R3 and the capacitor C2 that are provided between the collector and base of the transistor 122. The high pass filter circuit 150 has a characteristic of advancing a phase of a signal and therefore can compensate for a phase lag that occurs in the path X. Thus, oscillation is avoided, and the stability of the bias circuit 120 is improved. The high pass filter circuit 150 may have a frequency characteristic, for example, of passing a frequency component having a higher frequency than a modulation wave.

Figure 2:
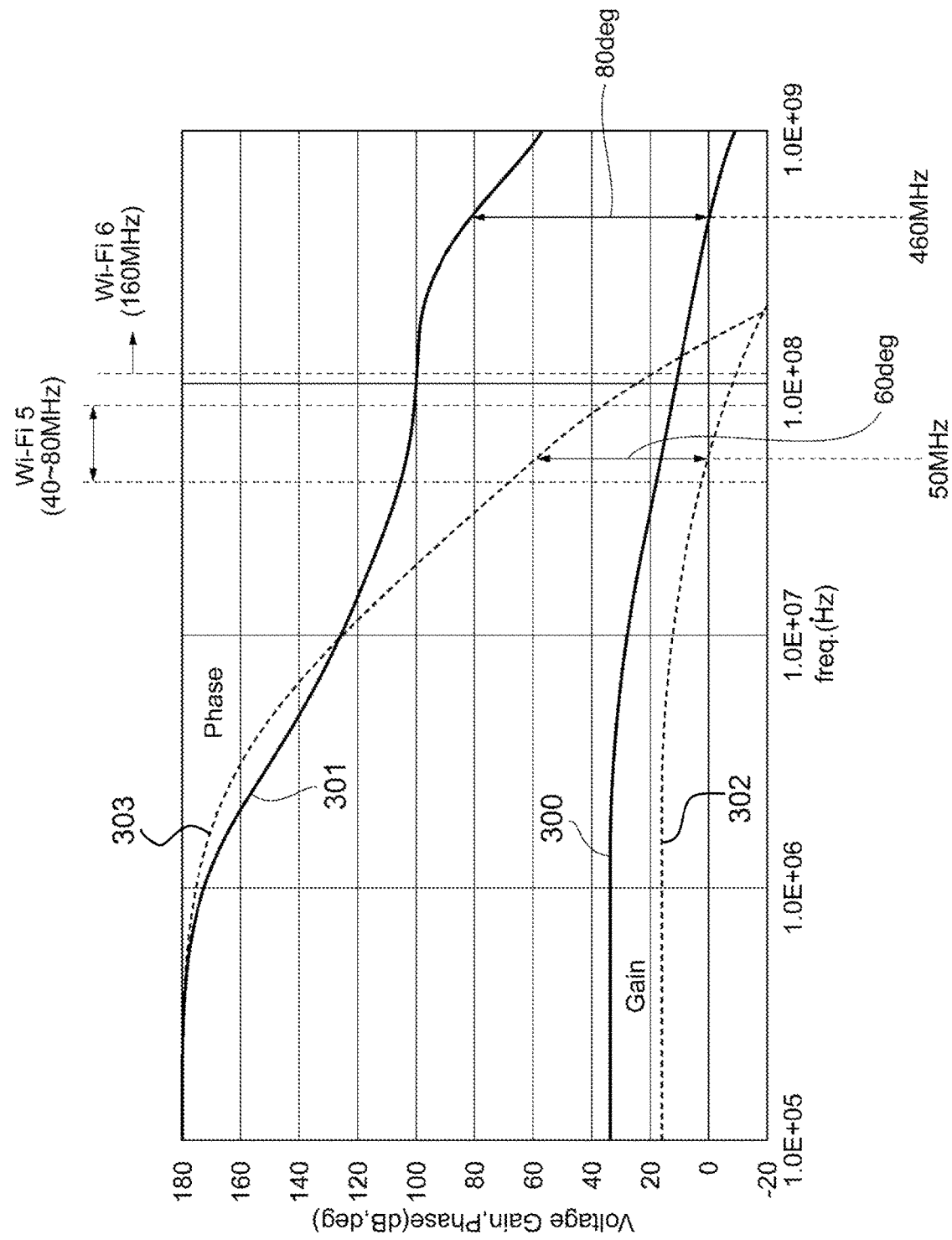
FIG. 2 is a graph illustrating simulation results of voltage gains and phases in the bias circuit illustrated in FIG. 1 and in a bias circuit according to a comparative example.

FIG. 2 is a graph illustrating simulation results of voltage gains and phases in the bias circuit 120 illustrated in FIG. 1 and in a bias circuit according to a comparative example. In this graph, a solid line 300 represents a voltage gain in the bias circuit 120, a solid line 301 represents a phase in the bias circuit 120, a dashed line 302 represents a voltage gain in the bias circuit according to the comparative example, and a dashed line 303 represents a phase in the bias circuit according to the comparative example. The bias circuit according to the comparative example does not include the high pass filter circuit 150 in comparison with the bias circuit 120 illustrated in FIG. 1 and includes a capacitor between the base of the transistor 124 and a ground as a low pass filter circuit. In this graph, the vertical axis represents voltage gain (dB) and phase (deg) in each bias circuit, and the horizontal axis represents frequency (Hz) of a signal.

As represented by the dashed line 303, in the comparative example, a phase shift proceeds as the frequency increases. Thus, for example, in a 40 to 80 MHz band, which is a modulation wave band of Wi-Fi 5, a phase margin ranging from about 40 to about 70 degrees is provided, but, in a band of not less than 160 MHz, which is a modulation wave band of Wi-Fi 6, a sufficient phase margin is not provided. For example, a phase margin when the gain reaches 0 dB is about 60 degrees, and a frequency at this time is about 50 MHz. In other words, when a sufficient phase margin is sought to be provided in Wi-Fi 6, the voltage gain has to be reduced.

On the other hand, as represented by the solid line 301, in the bias circuit 120, the amount of a phase shift is moderate in comparison with the comparative example even if the frequency of the signal increases. It is conceivable that this is because a first pole and a second pole move away from each other (that is, pole splitting) due to the high pass filter circuit 150 being included in the path X for negative feedback. Thus, for example, in the modulation wave band of Wi-Fi 5, a phase margin is about 100 degrees, and, in the modulation wave band of Wi-Fi 6 as well, this phase margin is substantially maintained. For example, a phase margin when the gain reaches 0 dB is about 80 degrees, and a frequency at this time is about 460 MHz. Thus, the bias circuit 120 provides a large phase margin in comparison with the comparative example even at a high frequency. In other words, the voltage gain can be increased.

As described above, the bias circuit 120 according to this embodiment includes the high pass filter circuit 150 as a phase compensation circuit in the path X for negative feedback (between the collector and base of the transistor 122 in this embodiment). Thus, a phase lagging due to a plurality of poles of the low pass filter circuit 140 in the path X can be advanced, and a phase margin can therefore be provided in a wide band. Hence, even if a frequency in a modulation wave band is relatively high, a voltage gain can be kept high, and signal amplification linearity can be improved.

Furthermore, in the bias circuit 120, the capacitor C2 serves as both an element of the low pass filter circuit 140 and an element of the high pass filter circuit 150. Hence, in comparison with a configuration in which the low pass filter circuit 140 and the high pass filter circuit 150 include respective specific capacitors, the number of necessary elements can be reduced. In particular, a capacitance value of the capacitor C2 seen from the base of the transistor 124 appears larger than an actual capacitance value by a factor equal to a voltage gain of the transistor 122 by the Miller effect. Hence, in comparison with a configuration in which, for example, a capacitor is provided between the base of the transistor 124 and the ground as a low pass filter circuit, the capacitance value of the capacitor C2 can be reduced.

In this embodiment, although the example has been described in which the bias circuit 120 is controlled by a reference current Iref, which is a constant current, the bias circuit 120 may adjust the level of a bias current or bias voltage by using a reference voltage in place of the reference current Iref. In this case, the reference voltage, which is a constant voltage, may be supplied to the collector of the transistor 121.

Furthermore, in the above-described bias circuit 120, although the configuration has been described in which the high pass filter circuit 150 is provided between the collector and base of the transistor 122, the location where a phase compensation circuit corresponding to the high pass filter circuit 150 is provided is not limited to this. The phase compensation circuit may be provided at any location in the path X and may be provided, for example, between the base of the transistor 121 and the base of the transistor 123.

Furthermore, the bias circuit 120 does not have to include the low pass filter circuit 140. Even if the bias circuit 120 does not include the low pass filter circuit 140, a phase lag caused by parasitic capacitance and parasitic inductance caused, for example, by a layout of transistors or lines in the path X is compensated for by the high pass filter circuit 150.

Furthermore, although FIG. 1 illustrates a configuration in which power of an RF signal is amplified in a single stage, the present bias circuit may be used in a power amplifier circuit in which power is amplified through two or more stages. In the case where the present bias circuit is used in the power amplifier circuit in which power is amplified in multiple stages, the bias circuit may be used, for example, for a final-stage amplifier. In the final-stage amplifier, output power of an RF signal is high in comparison with another stage amplifier, and thus the effect of the low pass filter circuit 140 and the high pass filter circuit 150 that are included in the present bias circuit is large. In this case, a bias circuit used for the other stage amplifier may have a configuration in which the transistor 124, the low pass filter circuit 140, and the high pass filter circuit 150 are not included in comparison with the bias circuit 120.

Figure 3:
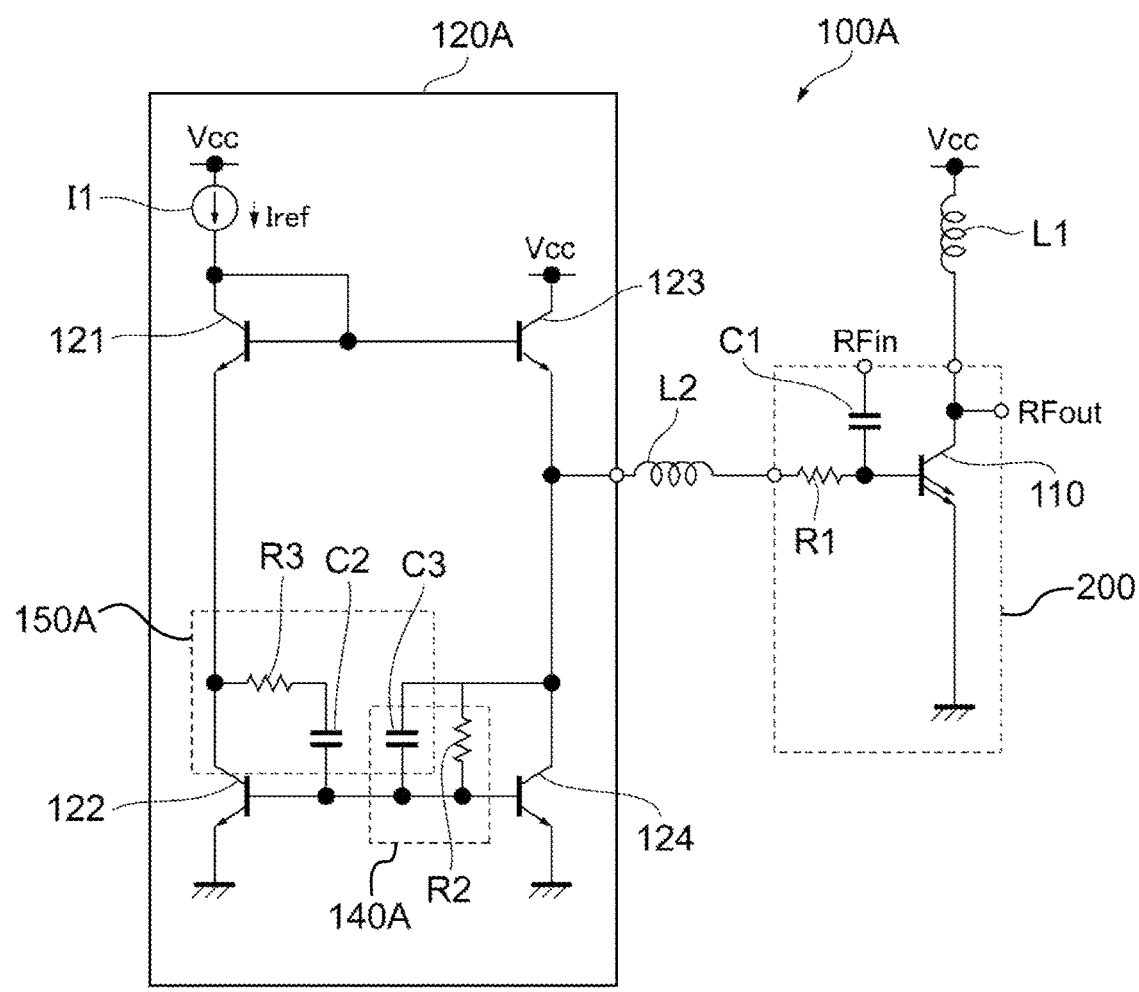
FIG. 3 illustrates an example of a configuration of a power amplifier circuit including a bias circuit according to a second embodiment of the present disclosure.

FIG. 3 illustrates an example of a configuration of a power amplifier circuit including a bias circuit according to a second embodiment of the present disclosure. In second and subsequent embodiments, a description of things in common with the first embodiment is omitted, and only respects in which the second and subsequent embodiments differ from the first embodiment will be described. In particular, similar function effects achieved by similar configurations are not repeatedly described in each embodiment.

As illustrated in FIG. 3, a power amplifier circuit 100A includes a bias circuit 120A in place of the bias circuit 120 in comparison with the above-described power amplifier circuit 100. The bias circuit 120A further includes a capacitor C3 in comparison with the bias circuit 120.

In the capacitor C3, one end is connected to the collector of the transistor 124, and the other end is connected to the base of the transistor 124. In other words, the capacitor C3 is connected in parallel with the resistance element R2. In the bias circuit 120A, the resistance element R2 and the capacitor C3 constitute a low pass filter circuit 140A. The resistance element R3 and the capacitors C2 and C3 constitute a high pass filter circuit 150A.

Even in such a configuration, the power amplifier circuit 100A achieves the same effect as the above-described power amplifier circuit 100. Furthermore, in the bias circuit 120A, capacitance values of the capacitors C3 and C2 can be designed to be respective values suitable for the low pass filter circuit 140A and the high pass filter circuit 150A.

Figure 4:
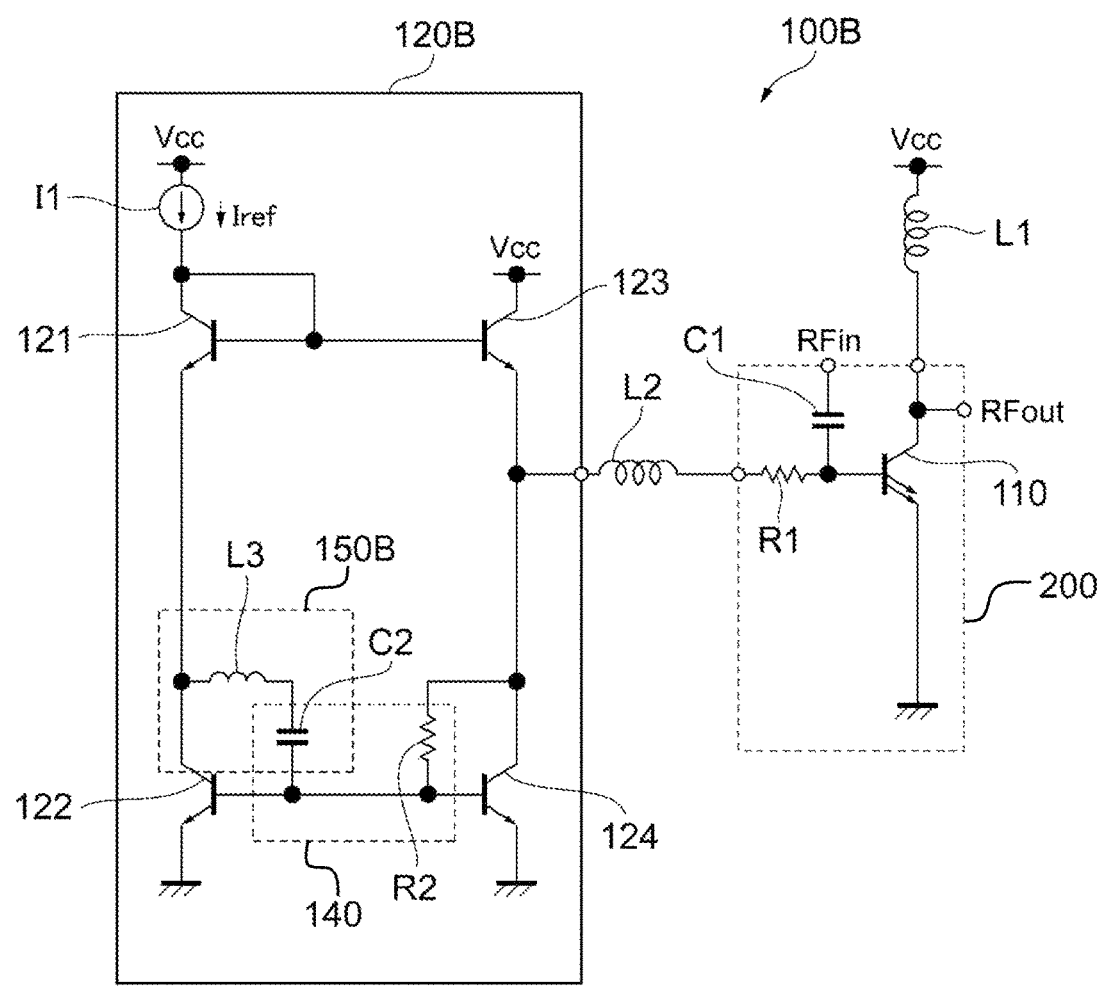
FIG. 4 illustrates an example of a configuration of a power amplifier circuit including a bias circuit according to a third embodiment of the present disclosure.

FIG. 4 illustrates an example of a configuration of a power amplifier circuit including a bias circuit according to a third embodiment of the present disclosure. As illustrated in FIG. 4, a power amplifier circuit 100B includes a bias circuit 120B in place of the bias circuit 120 in comparison with the above-described power amplifier circuit 100. The bias circuit 120B includes an inductor L3 in place of the resistance element R3 in comparison with the bias circuit 120.

The inductor L3 is connected in series with the capacitor C2 between the collector and base of the transistor 122. The inductor L3 and the capacitor C2 constitute a high pass filter circuit 150B.

Thus, a combination of elements constituting a high pass filter circuit is not limited to a combination of a resistance element and a capacitor and may be a combination of other elements, such as an inductor and so forth.

Figure 5:
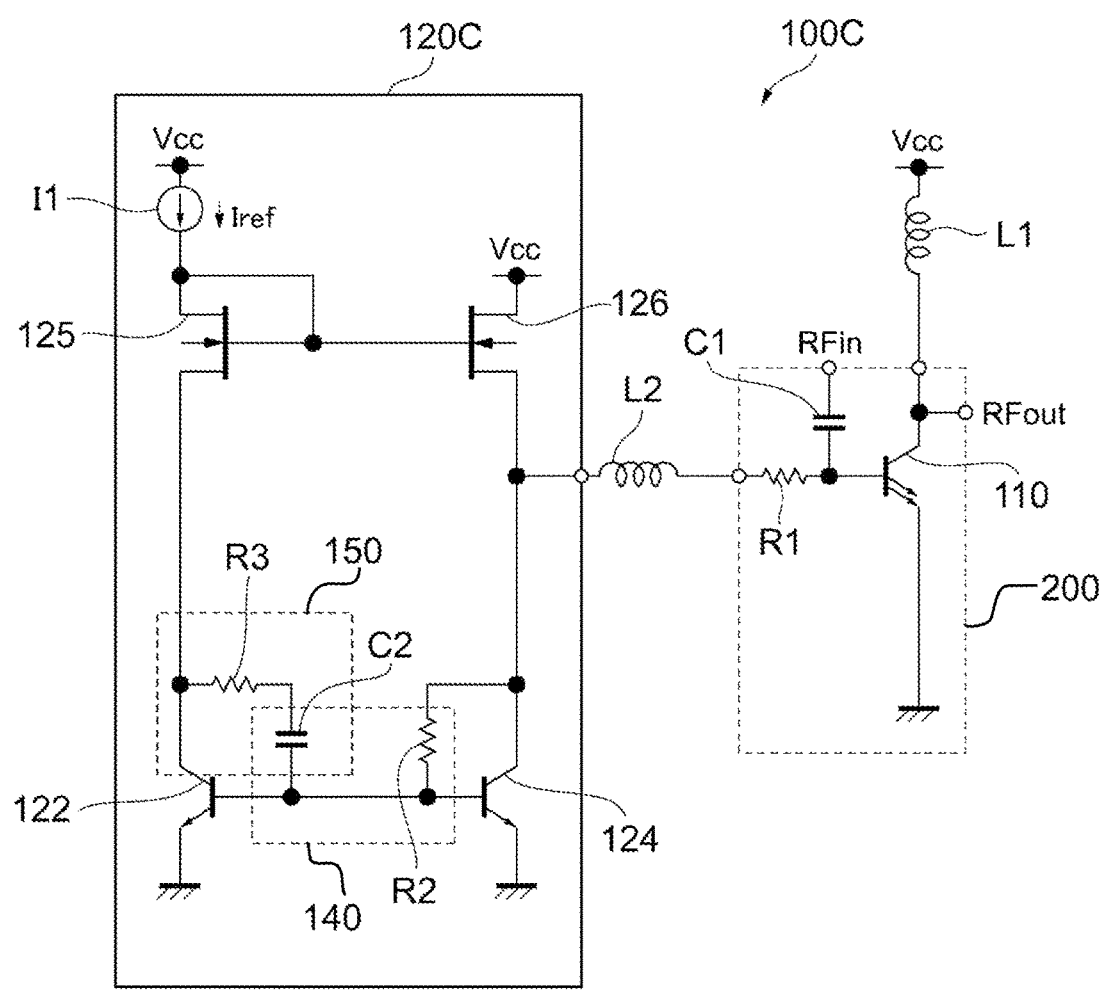
FIG. 5 illustrates a modification of transistors in the bias circuit illustrated in FIG. 1.
Figure 6:
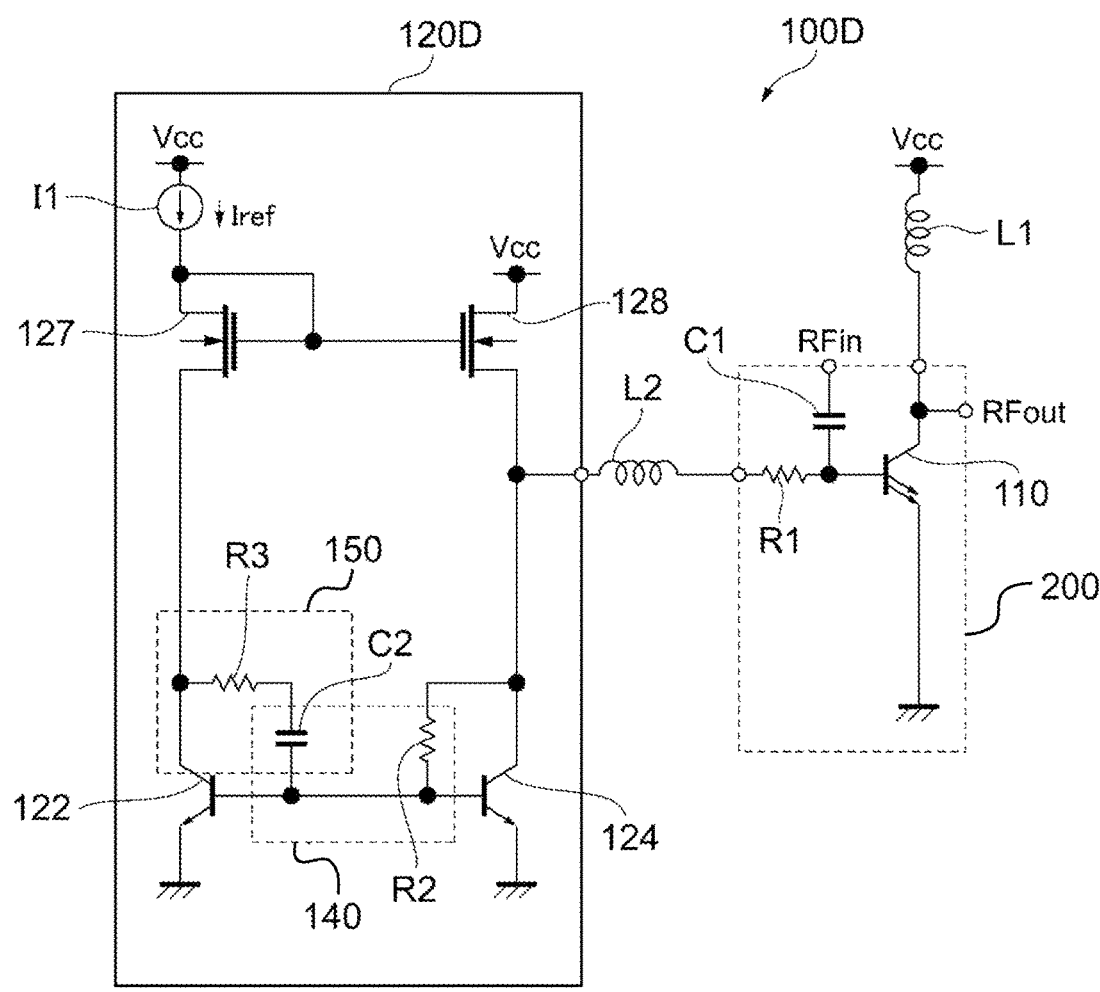
FIG. 6 illustrates a modification of transistors in the bias circuit illustrated in FIG. 1.
Figure 7:
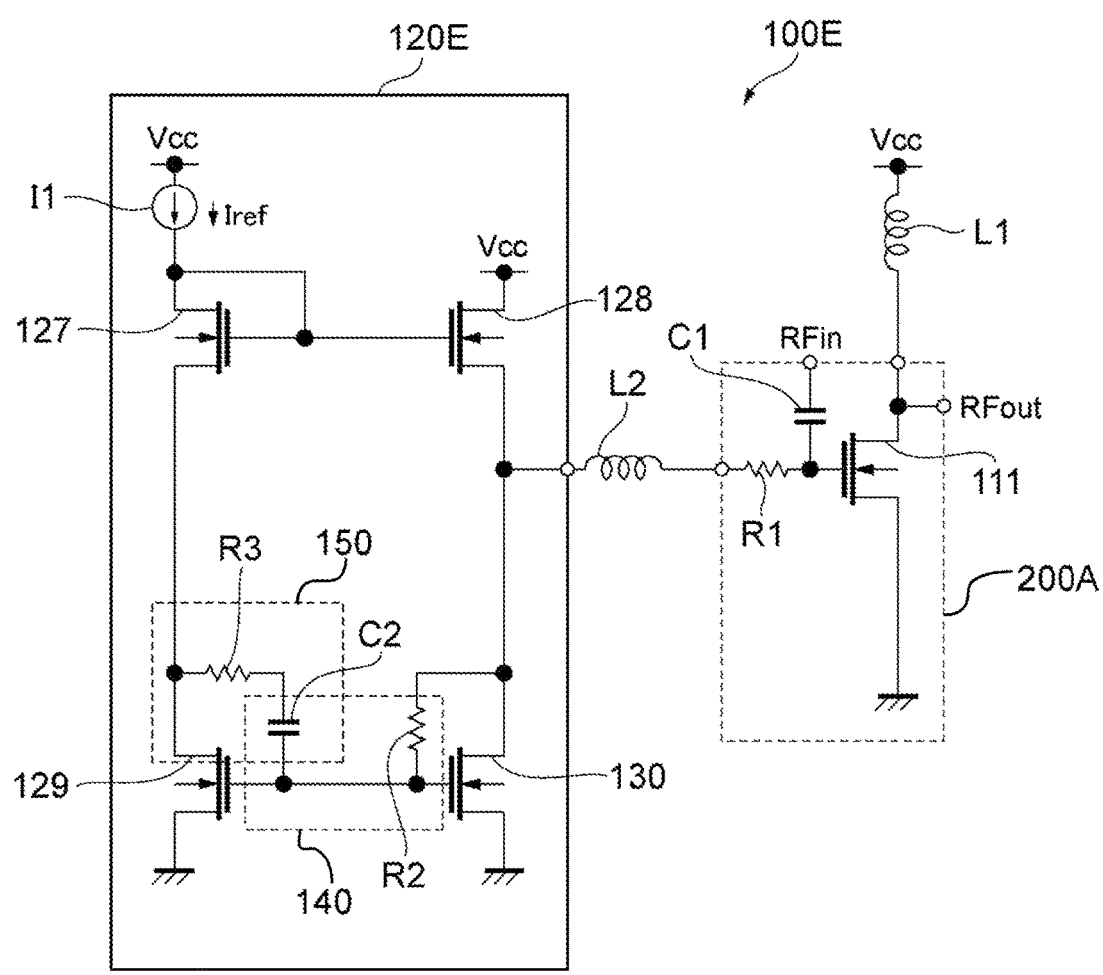
FIG. 7 illustrates a modification of transistors in the bias circuit illustrated in FIG. 1.

FIGS. 5 to 7 respectively illustrate power amplifier circuits 100C to 100E corresponding to modifications of transistors illustrated in FIG. 1.

As illustrated in FIG. 5, a bias circuit 120C includes field-effect transistors (FETs) 125 and 126 in place of the transistors 121 and 123, which are HBTs, in comparison with the bias circuit 120 illustrated in FIG. 1. The FETs 125 and 126 are, for example, N-channel junction FETs.

In the FET 125 (first transistor), a drain (first terminal) and a gate (second terminal) are connected, and a source (third terminal) is connected to the collector of the transistor 122. In the FET 126 (third transistor), a power supply voltage Vcc is supplied to a drain (first terminal), a gate (second terminal) is connected to the drain of the FET 125, and a source (third terminal) is connected to the base of the transistor 110 through the inductor L2 and the resistance element R1 and is also connected to the collector of the transistor 124. Thus, a bias current corresponding to a reference current Iref is supplied from the source of the FET 126 to the base of the transistor 110.

The bias circuit 120C includes the junction FETs 125 and 126 together with the transistors 122 and 124, which are HBTs, and thus may be fabricated by a bipolar FET (BiFET) process. The BiFET process is a fabrication process in which a bipolar transistor and a FET are formed on the same chip.

As illustrated in FIG. 6, a bias circuit 120D includes metal-oxide-semiconductor field-effect transistors (MOSFETs) 127 and 128 in place of the transistors 121 and 123, which are HBTs, in comparison with the bias circuit 120 illustrated in FIG. 1.

The structure of connections of the MOSFETs 127 (first transistor) and 128 (third transistor) is similar to the structure of connections of the FETs 125 and 126 illustrated in FIG. 5, and a detailed description thereof is omitted.

The bias circuit 120D includes the MOSFETs 127 and 128 together with the transistors 122 and 124, which are HBTs, and thus may be fabricated by a bipolar complementary metal-oxide-semiconductor (BiCMOS) process. The BiCMOS process is a fabrication process in which a bipolar transistor and a CMOS are formed on the same chip.

As illustrated in FIG. 7, a bias circuit 120E includes MOSFETs 129 and 130 in place of the transistors 122 and 124, which are HBTs, in comparison with the bias circuit 120D illustrated in FIG. 6. Furthermore, in the power amplifier circuit 100E, a cell 200A includes a MOSFET 111 in place of the transistor 110, which is an HBT, in comparison with the power amplifier circuit 100.

In the MOSFET 129 (second transistor), a drain (first terminal) is connected to a source of the MOSFET 127, a gate (second terminal) is connected to a gate of the MOSFET 130, and a source (third terminal) is grounded. Furthermore, the drain and gate of the MOSFET 129 are connected by the high pass filter circuit 150.

In the MOSFET 130 (fourth transistor), a drain (first terminal) is connected to a source of the MOSFET 128, the gate (second terminal) is connected to the gate of the MOSFET 129, and a source (third terminal) is grounded. Furthermore, the drain and gate of the MOSFET 130 are connected by the resistance element R2.

The bias circuit 120E includes no HBT and is constituted by transistors, all of which are MOSFETs, and thus may be fabricated by a CMOS process or silicon-on-insulator (SOI) process.

In the MOSFET 111, a power supply voltage Vcc is supplied to a drain through the inductor L1, an RF signal RFin is supplied to a gate through the capacitor C1, and a source is grounded. A bias current or bias voltage is supplied from the bias circuit 120E to the gate of the MOSFET 111 through the inductor L2 and the resistance element R1.

Thus, an amplifier transistor included in the power amplifier circuit 100 and transistors included in the bias circuit 120 are not limited to a bipolar transistor, and some or all of them may be a junction FET or MOSFET. For example, a FET is capable of operating at a lower threshold voltage than a bipolar transistor and is thus capable of operating at a lower voltage than the above-described bias circuit 120, thereby enabling a reduction in power consumption of a battery.

The exemplary embodiments of the present disclosure have been described above. Each of the bias circuits 120 and 120A to 120E is a bias circuit configured to supply a bias current or bias voltage to an amplifier transistor configured to amplify an input signal. Each of the bias circuits 120 and 120A to 120E includes a first transistor, a second transistor, a third transistor, and a fourth transistor that each includes a first terminal, a second terminal and a third terminal; and a phase compensation circuit configured to advance a phase of a signal. In the first transistor, a reference current or reference voltage is supplied to the first terminal, and the first terminal and the second terminal are connected to each other. In the second transistor, the first terminal is connected to the third terminal of the first transistor, and the third terminal is grounded. In the third transistor, a power supply voltage is supplied to the first terminal, the second terminal is connected to the first terminal of the first transistor, and the bias current or bias voltage is supplied from the third terminal to the amplifier transistor. In the fourth transistor, the first terminal is connected to the third terminal of the third transistor, the second terminal is connected to the second terminal of the second transistor, and the third terminal is grounded. The phase compensation circuit is provided in a path extending from the second terminal of the fourth transistor to the second terminal of the third transistor through the second transistor and the first transistor. Thus, a phase that is lagging in the path can be advanced by the phase compensation circuit, and a phase margin can therefore be provided in a wide band. Hence, even if a frequency in a modulation wave band is relatively high, a voltage gain can be kept high, and signal amplification linearity can be improved.

Each of the bias circuits 120 and 120A to 120E further includes a low pass filter circuit provided in the path extending from the second terminal of the fourth transistor to the second terminal of the third transistor through the second transistor and the first transistor and having a frequency characteristic of attenuating a frequency component of a fundamental of the input signal. In the low pass filter circuit, a phase of a signal lags, and thus the present disclosure desirably functions.

In each of the bias circuits 120 and 120B to 120E, the low pass filter circuit includes a first resistance element connected between the first terminal and the second terminal of the fourth transistor, and a second capacitor connected between the first terminal and the second terminal of the second transistor. Thus, the second capacitor can serve as both an element of the low pass filter circuit and an element of the phase compensation circuit, and the number of necessary elements can therefore be reduced in comparison with a configuration in which these circuits include respective specific capacitors.

In each of the bias circuits 120 and 120A to 120E, the phase compensation circuit may be a high pass filter circuit including, but not limited to, particular elements, such as a second capacitor and a second resistance element that are connected in series with each other between the first terminal and the second terminal of the second transistor.

In each of the bias circuits 120, 120A, and 120B, the first transistor, the second transistor, the third transistor, and the fourth transistor are HBTs. All of four transistors are HBTs, and thus each bias circuit can be fabricated on the same chip by a bipolar process.

In each of the bias circuits 120C and 120D, the first transistor and the third transistor are FETs, and the second transistor and the fourth transistor are HBTs. A FET is capable of operating at a lower threshold voltage than an HBT and is thus capable of operating at a lower voltage than the bias circuit 120, thereby enabling a reduction in power consumption of a battery.

The above-described embodiments are intended to facilitate understanding of the present disclosure but are not intended for a limited interpretation of the present disclosure. The present disclosure can be changed or improved without necessarily departing from the gist thereof and encompasses equivalents thereof. That is, appropriate design changes made to the embodiments by those skilled in the art are also encompassed in the scope of the present disclosure as long as the changes have features of the present disclosure. For example, elements included in the embodiments, and the arrangement, materials, conditions, shapes, sizes, and so forth of the elements are not limited to those exemplified herein and can be appropriately changed. Furthermore, the elements included in the embodiments can be combined as much as technically possible, and such combined elements are also encompassed in the scope of the present disclosure as long as the combined elements have features of the present disclosure.

While embodiments of the disclosure have been described above, it is to be understood that variations and modifications will be apparent to those skilled in the art without necessarily departing from the scope and spirit of the disclosure. The scope of the disclosure, therefore, is to be determined solely by the following claims.

What is claimed is:

1. A bias circuit configured to supply a bias current or a bias voltage to an amplifier transistor, the amplifier transistor being configured to amplify an input signal, the bias circuit comprising:
a first transistor, a second transistor, a third transistor, and a fourth transistor that each have a first terminal, a second terminal, and a third terminal; and
a phase compensation circuit configured to advance a phase of a signal,
wherein a reference current or a reference voltage is supplied to the first terminal of the first transistor, and the first terminal of the first transistor and the second terminal of the first transistor are connected to each other, wherein the first terminal of the second transistor is connected to the third terminal of the first transistor, and the third terminal of the second transistor is grounded, wherein a power supply voltage is supplied to the first terminal of the third transistor, the second terminal of the third transistor is connected to the first terminal of the first transistor, and the bias current or the bias voltage is supplied from the third terminal of the third transistor to the amplifier transistor, wherein the first terminal of the fourth transistor is connected to the third terminal of the third transistor, the second terminal of the fourth transistor is connected to the second terminal of the second transistor, and the third terminal of the fourth transistor is grounded, and wherein the phase compensation circuit is in a path that connects the second terminal of the fourth transistor to the second terminal of the third transistor through the second transistor and the first transistor.

2. The bias circuit according to claim 1, further comprising:
a low pass filter circuit in the path, the low pass filter circuit being configured to attenuate a fundamental frequency component of the input signal.

3. The bias circuit according to claim 2, wherein the low pass filter circuit comprises:
a first resistance element connected between the first terminal of the fourth transistor and the second terminal of the fourth transistor, and
a second capacitor connected between the first terminal of the second transistor and the second terminal of the second transistor.

4. The bias circuit according to claim 1, wherein the phase compensation circuit is a high pass filter circuit.

5. The bias circuit according to claim 4, wherein the high pass filter circuit comprises a second capacitor and a second resistance element that are connected in series with each other between the first terminal of the second transistor and the second terminal of the second transistor.

6. The bias circuit according to claim 3, wherein:
the phase compensation circuit is a high pass filter circuit, and
the high pass filter circuit comprises the second capacitor and a second resistance element that are connected in series with each other between the first terminal of the second transistor and the second terminal of the second transistor.

7. The bias circuit according to claim 4, wherein the high pass filter circuit comprises an inductor and a second capacitor that are connected in series with each other between the first terminal of the second transistor and the second terminal of the second transistor.

8. The bias circuit according to claim 2, wherein the low pass filter circuit comprises:
a first resistance element and a first capacitor connected in parallel with each other between the first terminal of the fourth transistor and the second terminal of the fourth transistor.

9. The bias circuit according to claim 5, further comprising:
a low pass filter circuit in the path, the low pass filter circuit being configured to attenuate a fundamental frequency component of the input signal,
wherein the low pass filter circuit comprises a first resistance element and a first capacitor connected in parallel with each other between the first terminal of the fourth transistor and the second terminal of the fourth transistor.

10. The bias circuit according to claim 1, wherein the first transistor, the second transistor, the third transistor, and the fourth transistor are heterojunction bipolar transistors.

11. The bias circuit according to claim 1, wherein the first transistor and the third transistor are field-effect transistors, and the second transistor and the fourth transistor are heterojunction bipolar transistors.

12. The bias circuit according to claim 1, wherein the first transistor and the third transistor are field-effect transistors, and the second transistor and the fourth transistor are heterojunction bipolar transistors.

13. The bias circuit according to claim 1, wherein the first transistor and the third transistor are field-effect transistors, and the second transistor and the fourth transistor are heterojunction bipolar transistors.

14. The bias circuit according to claim 1, wherein the first transistor and the third transistor are field-effect transistors, and the second transistor and the fourth transistor are heterojunction bipolar transistors.

15. The bias circuit according to claim 5, wherein the first transistor, the second transistor, the third transistor, and the fourth transistor are heterojunction bipolar transistors.

16. The bias circuit according to claim 6, wherein the first transistor, the second transistor, the third transistor, and the fourth transistor are heterojunction bipolar transistors.

17. The bias circuit according to claim 2, wherein the first transistor and the third transistor are field-effect transistors, and the second transistor and the fourth transistor are heterojunction bipolar transistors.

18. The bias circuit according to claim 3, wherein the first transistor and the third transistor are field-effect transistors, and the second transistor and the fourth transistor are heterojunction bipolar transistors.

19. The bias circuit according to claim 4, wherein the first transistor and the third transistor are field-effect transistors, and the second transistor and the fourth transistor are heterojunction bipolar transistors.

20. The bias circuit according to claim 5, wherein the first transistor and the third transistor are field-effect transistors, and the second transistor and the fourth transistor are heterojunction bipolar transistors.

* * * * *